United States Patent [19]

Cooper et al.

[11] Patent Number: 4,900,715
[45] Date of Patent: Feb. 13, 1990

[54] METHOD OF PREPARING SUPERCONDUCTING "ORTHORHOMIBIC"-TYPE COMPOUNDS IN BULK USING $C_1$-$C_6$ ALKANOIC ACID SALTS

[75] Inventors: John C. Cooper, Burke, Va.; Ramanathan Panayappan, Potomac, Md.; Joseph T. Guy, East Flatrock, N.C.

[73] Assignee: The United States of America as represented by the Secretary of the Navy, Washington, D.C.

[21] Appl. No.: 161,936

[22] Filed: Feb. 29, 1988

[51] Int. Cl.$^4$ .................... C01F 17/00; C01G 3/02; H01L 39/12

[52] U.S. Cl. ........................ 505/1; 252/518; 252/521; 423/263; 423/593; 423/604; 423/636; 501/123; 501/126; 505/809; 505/810

[58] Field of Search .................... 252/518, 521; 505/1, 505/809, 810; 423/263, 593, 604, 636; 501/123, 126

[56] References Cited

U.S. PATENT DOCUMENTS 4,049,789 9/1977 Manabe .................... 423/593
4,804,649 2/1989 Sherif .................... 505/1

OTHER PUBLICATIONS

Davidson, W. W. et al.: *MRS Symposium Proceedings*, vol. 99, High Temperature Superconductors, Nov. 30--Dec. 4, 1987, Boston, pp. 289-292.

Hamdi, A. H. et al.: *Appl. Phys. Lett.*, 51(25), 21 Dec. 1987, pp. 2152-2154.

Rice, C. E. et al.: *Appl. Phys. Lett.*, 51(22), 30 Nov. 1987, pp. 1842-1844.

"Processing and Properties of the High $T_c$ Superconducting Oxide Ceramic $YBa_2$-$CU_3O_7$", Compilation of NRL Publications on High Temperature Superconductivity, pp. 63-65, (Jul. 1987), Bender et al.

Preparation, Structure and Magnetic Field Studies of High $T_c$ Superconductors, Compilation of NRL Publications on High Temperature Superconductivity, pp. 105-113, (Jul. 1987), Osofsky et al.

*Primary Examiner*—Dennis Albrecht
*Attorney, Agent, or Firm*—Thomas E. McDonnell; A. David Spevack

[57] ABSTRACT

Superconducting compositions of the general formula $A_nQ_mCu_3O_y$ are prepared by wet mixing a combination organic acid salts, inorganic acid salts and oxides of A, Q and Cu, wherein at least one salt is an organic acid salt, drying the mixed salts, and then heating the resultant mixed salts to a temperature between 500° and 950° C. The temperature is maintained for a time sufficient to form a substantially orthorhombic superconducting composition. The method achieves good results with only one heating step. The presence of at least one organic salt causes carbonate and nitrate salts of A, Q and Cu to convert to oxides at temperatures between 300° and 400° C. With lower processing temperatures, semiconductor materials and superconducting materials can be processed together.

12 Claims, 2 Drawing Sheets

METHOD OF PREPARING SUPERCONDUCTING "ORTHORHOMBIC"-TYPE COMPOUNDS IN BULK USING $C_1$-$C_6$ ALKANOIC ACID SALTS

BACKGROUND OF THE INVENTION

1. Field of the Invention

This invention relates to a bulk method of preparing substantially orthorhombic superconducting compounds. Specifically, this invention relates to a method of preparing "High-Tc" superconductors having the general formula $A_nQ_mCu_3O_y$ by intimately mixing pastes of lower alkyl organic acids salts, inorganic acids salts and oxides of A, Q and Cu wherein at least one of A, Q and Cu is present as the organic acid salt and then heating the resultant mixed compounds to 500° to 950° C. to form the superconducting composition.

2. Description of the Prior Art

The phenomenon of superconductivity was first observed and reported in mercury below 4° K. and named by Onnes, Leiden Comm. 124C (1911). This evoked interest in discovering new materials with higher superconducting transition temperature (Tc). Initial research for superconductivity was directed at surveying elements and simple alloys to determine their superconducting properties. F. London, in J. of Chem and Physics 5 (1937), was first to speculate that supercurrents might exist in non-metal systems such as aromatic organic molecules.

During the 1950's, superconductivity research explored two principal themes: (1) development of a microscopic theory, and (2) development of empirical rules to guide the search for new superconducting materials. The first theme is exemplified by the Bardeen, Cooper, Schrieffer Theory of Superconductivity, Phys. Rev. 106, 162 (1957) and Phys. Rev. 108 1175 (1957).

The second theme included development of such empirical rules as the electron per atom, e/z ratio described by B. T. Mathias, Phys. Rev. 97 74 (1955); inverse correlations with Debye temperatures presented by J. DeLaunay and R. Dolecek, Phys. Rev. 72 141 (1947); direct correlations with specific heat noted by H. W. Lewis, Phys. Rev. 101, 93(1956); and symmetry preferences (cubic symmetry favored over lower symmetry structures) discussed by B. T. Mathias, T. H. Geballe and V. B. Compton, Reviews of Modern Phys. 35, 1 (1963).

The decade of the 1960's extending into the 1970's saw rapid advances in superconductivity research with the potential for practical application being realized wih the discovery of the Josephson effect reported in Phys. Lett. 1, 251 (1962), and the further exploration of unusual systems. In the 60's, researchers applied empirical rules and only explored the standard classes of metallic alloys and compounds.

A significant advance on the road to high Tc materials occurred in 1972 when B. T. Mathias et al. reported in Science 175, 1465 (1972) superconductivity in the composition $PbMO_6S_8$. This composition is a ternary superconductor. This discovery was followed in the late 70's and early 80's by the discovery of superconductivity in "heavy Fermion" systems, Steglich et al., Phys. Rev. Lett. 43, 1892, (1979) and in nearly magnetic systems, Ott et al. Phys. Rev. Lett. 55, 1595 (1985).

The possibility of superconductivity in semiconductor type materials was first predicted by Cohen, Phys. Rev. 134, A511 (1964). Shortly thereafter, Schooley et al. Phys. Rev. Lett 14, 305 (1965) reported discovery of superconductivity in $SrTiO_3$. This was the first perovskite superconducting material.

In 1973, Johnston discovered superconductivity in $LiTiO_3$ at temperatures as high as 13K, Mat. Res. Bull. 8, 777 (1973). This was followed by a report of superconductivity at 14K in $PbBiBaO_3$, Sleight et al. Sol. State Comm. 17, 27 (1975). The $PbBiBaO_3$ composition shows potential application as a sensor of electromagnetic radiation.

The discovery by Bednorz and Muller of a new class of superconducting materials in the lanthanum-barium (strontium)-copper oxide system with $T_c$ above 30K renewed interest in the field by a great number of workers. Z. Phys. B, 64, 189 (1986). Report of Bednorz and Muller's work was followed by the report of Wu and Chu on a material in the Y-Ba-Cu-O system with Tc above 90K, Phys. Rev. Lett. 58, 908 (1987).

Analysis of x-ray diffraction data suggested the presence of at least three phases in the Wu et al. composition. Subsequent work identified the active oxide, as $YBa_2Cu_3O_7$, Cava et al., Phys. Rev. Lett. 58,1676 (1987), Rhyne et al., Phys. Rev. 3, 36, 2294 (1987).

Current methods for preparing the superconducting orthorhombic phase of $YBa_2Cu_3O_7$(1,2,3) in bulk quantities rely on repeated temperature cycling of mixtures of either $Y_2O_3$, $BaCO_3$ and CuO or the corresponding nitrate salts. The conventional synthetic methods depend critically on thermal decomposition in a calcining stage above 900° C. and oxygen incorporation in the 550°-950° C. region. Beyers et al. Appl. Phys. Lett. 57, 614 (1987). The kinetics of $O_2$ incorporation and metal atom migration normally require repeated heating, cooling and sintering to reach the orthorhombic phase in optimal purity.

Applications of superconducting materials require compatibility with various substrates and electronic materials. These substrates and electronic materials are normally incapable of high temperature cycling.

As superconducting compositions with higher Tc's are devised, the well known practical applications of superconducting materials such as described in "Superconducting Machines and Services," edited by Foner and Schwartz, Nato Advanced Study Institute, Plenum, 1973, come closer to reality. The superconducting compositions made by this invention can be used in any of the well known applications and, will also allow formation of superconducting compositions together with semiconductors and other materials not compatible with high-temperature processing or repeated high temperature cycling.

SUMMARY OF THE INVENTION

Accordingly, it is an object of this invention to prepare superconducting compositions at lower temperatures.

Further, it is an object of this invention to prepare the superconducting compositions with a single high-temperature cycle.

Yet another object of this invention is to prepare superconducting compositions at temperatures compatible with temperatures for semiconductor devices.

In addition, it is an object of this invention to prepare the superconducting compositions in bulk with a high yield of tetragonal free meterials and high purity of the superconducting orthorhomic phase.

These and other objects of the invention are accomplished by forming a substantially orthorhomic superconducting composition of the general formula $A_nQ_mCu_3O_y$. The composition is made by wet mixing compounds of A, Q and Cu and heating this mixture to a preselected temperature in the range of about 500° C. to about 950° C. The preselected temperature is held for a time sufficient to incorporate oxygen and form the superconducting composition. The compounds of A, Q of Cu can be lower alkyl organic acid salts, inorganic acid salts or oxides. In the wet mix, at least one of A, Q or Cu must be a lower alkyl organic acid salt.

When more than one compound of A, Q and Cu is to be in the form of a lower alkyl organic acid salt, these acid salts should be prepared by mixing two or more of the nitrate or carbonate salts of A, Q and Cu, treating the mixed salts with a strong alkali metal base, and treating the resulting product with a lower alkyl organic acid.

BRIEF DESCRIPTION OF THE DRAWINGS

A more complete appreciation of the invention will be readily understood by reference to the Description of the Prefered Embodiments and the accompanying drawings, wherein.

DESCRIPTION OF THE PREFERRED EMBODIMENT

Figure 1:
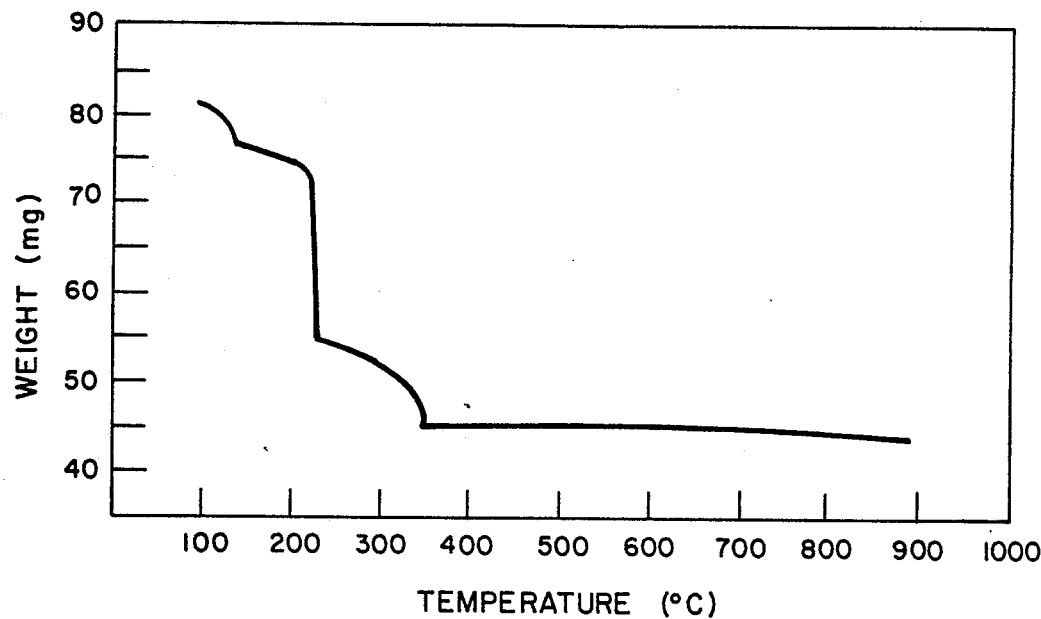
FIG. 1 is a graph of Thermogravimetric Analysis (TGA) of the mixture of Yttrium, Barium and Copper Formates in oxygen.

The superconducting composition of this invention has the general formula $A_nQ_mCu_3O_y$. A is any of the rare earth elements which are recognized as contributing to a superconducting structure. These rare earth elements include Yttrium (Y), Lutetium (Lu), Neodynium (Nd), Samarium (Sm), Europium (Eu), Gadolinium (Gd), Erbium (Er), Holmium (Ho), and Ytterbium (Yb). Q is any of the alkaline earth elements which are recognized as contributing to a superconducting structure. These alkaline earth elements include Calcium (Ca), Barium (Ba) and Strontium (Sr). For the purposes of distinguishing these rare earth elements and alkaline earth elements from the remaining rare earth and alkaline earth elements, we shall refer to them generically as the Cuprate Superconducting Facilitating Elements (CSFE). n is 1 or 2. m is 1 or 2. y is $3n + 2m + 4/2$. The prefered A is Yttrium and the prefered Q is Barium.

The wet mixing process of this invention achieves an intimate uniform mixture of ingredients. Wet mixing is the stirring of a slurry of ingredients during the preparation stage. Of course, the end mixture is dried before the final heating step. This mixing process is conducted under ambient conditions, although, when needed because of materials, wet mixing can be conducted under pressure or under special non-reactive atmospheric conditions.

A substantially orthorhomic superconducting composition of the formula $A_nQ_mCu_3O_Y$ is prepared by wet mixing compounds of A, Q and Cu, heating the mix to a predetermined temperature in the range of about 500° to about 950° C. and holding this predetermined temperature for a time sufficient to incorporate oxygen and form the "High-Tc" superconducting composition.

These compounds of A, Q and Cu are the lower alkyl organic acid salts having 1 to 6 carbons, inorganic acid salts, and oxides of A, Q and Cu or mixtures of these. At least one of A, Q or Cu in the wet mix must be in the form of the lower alkyl organic acid salt. The most prefered organic acid salts are formates and acetates. The prefered inorganic acid salts are carbonates and nitrates.

To form a superconducting composition, it is customary to use oxides directly or to convert compounds such as nitrates and carbonates of A, Q and Cu to oxides and then heat the mixed oxides to a temperature above 900° C. to form the superconducting composition. To convert compounds such as carbonates and nitrates of A, Q and Cu to oxides, it is necessary to calcine the carbonates and nitrates at temperatures in excess of 900° C.

We have found that the inclusion of at least one organic salt of A, Q or Cu in the mixed compounds of A, Q and Cu reduces the calcine temperature of the entire mixture. The mixture calcines at lower temperatures of 300° to 400° C. We found that $BaCO_3$ is completely decomposed to the oxide at a temperature of about 320° C. When all of the compounds of A, Q and Cu are present as formates, the formates will decompose to the oxide at approximately 350° C. This temperature suppression by the organic acid salt permits the use of a single high temperature heating step and less handling and grinding than are used in other process.

The compounds of A, Q, Cu are mixed in Stoiciometric amounts to obtain the desired combination of A, Q, Cu and oxygen. In one prefered embodiment where Q is Ba the ratio of A:Ba:Cu is 1:2:3.

There is no problem in providing a proper ratio with carbonates or nitrates. But, the end product is not supconducting where two or more individually prepared organic acid salts of A, Q and Cu are mixed directly.

We have found that when two or more of the salts of A, Q and Cu are used in the form of organic acid salts the salts should be prepared together by mixing stoichiometric amounts of carbonates or nitrates, or mixtures of these, of A, Q or Cu togther and then treating these two or more mixed salts with a stoichiometric quantity of a strong alkaline metal base such as NaOH or KOH, preferably 5M NaOH to create a slurry. The resulting slurry is stirred for a sufficient time for the materials to react, preferably 15 to 40 minutes most preferably about 20 minutes. The slurry is filtered and the precipitate washed several times with any solvent which will remove the resulting acid formed. Most preferably the wash should be an alcohol, or ASTM Type 1 water (standard specification for Reagent Water D-1193-77, Water (1977) ASTM, Phil pg 20) or equivalent. The precipitate is air dried.

Subsequently, an equivalent of a lower alkyl organic acid, preferably an acid with 1-6 carbons, most preferably formic or acetic acid is reacted with the precipitate to form a homogenous paste of metal organic acid salt. The organic acid salt is air dried with heat to yield a powder.

The final superconducting composition is prepared by either adding the necessary quantities of nonorganic compounds of A, Q and Cu to the prepared organic acid salts of A, Q or Cu or using the prepared mixture of three organic acid salts and then heating the combination in air or preferably under continuous flowing oxygen to a final preselected temperature of between 500° C. to 950° C. preferably about 900°–940° C. and most preferably at about 920° C. The salt mixture is heated to this preselected temperature from room temperature at a slow rate, preferably about 20° C./min. Once the preselected temperature is reached, the temperature is maintained for a ½ to 10 hours, preferably about 1 hour to permit complete formation of the crystal structure and absorbtion of oxygen into the "High-Tc" superconducting composition.

The superconducting composition is cooled to room temperature in an oxygen atmosphere and used as needed. There is less need for slow cooling by this process than is needed for processes requiring several heating and cooling cycles.

Now having generally described this invention, the following example illustrates specific application of the invention.

EXAMPLE

A mixture of the three metal salts $Y(NO_3)_3 \cdot 6H_2O$, $BaCO_3$ and $Cu(NO_3)_2 \cdot 3H_2O$ is prepared in the proper stoichiometric ratio 1:2:3 of the elements Y, Ba and Cu, respectively. The finely ground mixture is then treated with the proper stoichiometric equivalent of 5M sodium hydroxide solution (13 moles of NaOH per mole of Y) at room temperature. After 20 min. of stirring, the light blue mixture is filtered and washed several times with ASTM type I water and air dired. An equivalent (13 moles of formate per mole of Y) of formic acid is added to the dry precipitate resulting in a homogenous blue paste. The paste is then heated to 85° C. in air to dryness, yelding a royal blue powder (87% yield).

The metal-formate mixture is heated in a DuPont 951 thermogravimetric analyzer under continuous $O_2$ flow (0.5 L/Min.) to a final temperature of 920° C. at a heating rate of 20° C./Min, maintained at 920° C. for 1 hr. and then lowered to room temperature in the flowing oxygen atmosphere to form the superconducting $YBa_2Cu_3O_7$.

In analyzing the resultant material, magnetization measurements are recorded on a SHE SQUID Magnetometer at 200 G. Powder x-ray diffraction patterns are measured using Cu $K_{a1}$ and $K_{a2}$ radiation on a Phillips XRG-3100 with an ADP-1700 powder x-ray diffraction attachment. The x-ray data are collected in 0.02° steps at a rate of 1.0 sec./step.

A representative TGA trace is shown in FIG. 1 for the mixture of yttrium, barium and copper formates in the stoichiometric 1:2:3 ratio of elements Y, Ba, Cu respectively. Weight loss (presumably of water) is observed between 100° and 140° C. After depletion of the residual water, several decompostion steps are observed which begin at 240° C. and are complete at 350° C. With continued temperature ramping, weight gain indicative of $O_2$ uptake is observed to occur from 450° to 520° C. The residual product corresponds to 57.9% of the starting weight. This compares to a theoretical value of 58.4% for pure $YBa_2Cu_3O$. The difference in the experimental and the expected yield is within the ability to accurately control the water content of the formate salts.

Figure 2:
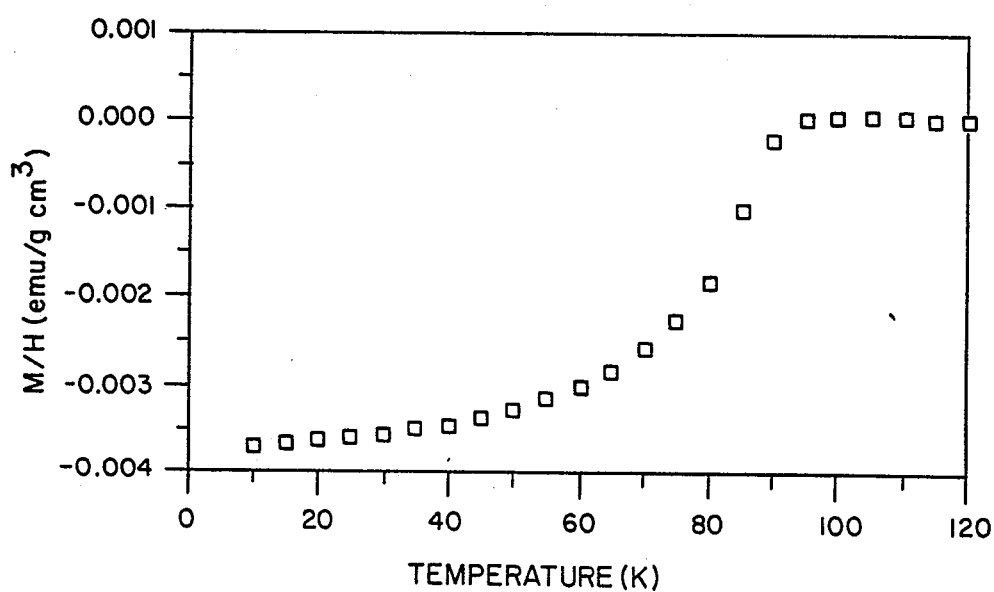
FIG. 2 is a graph of Volume Susceptibility vs Temperature (200 G Field) of the resulting heated mixture shown in FIG. 1.

The magnetic properties of the sample, as shown in FIG. 2, indicate that a significant portion of the superconducting phase is present. The onset temperature of 95K is comparable to that reported for single phase $YBa_2Cu_3O_7$. The broad tail below 80K to the limiting value of $X_y = -3.7 \times 10^{-3}$ emu/cm$^3$ suggests that there is some inhomogeneity compared with single phase materials.

Figure 3:
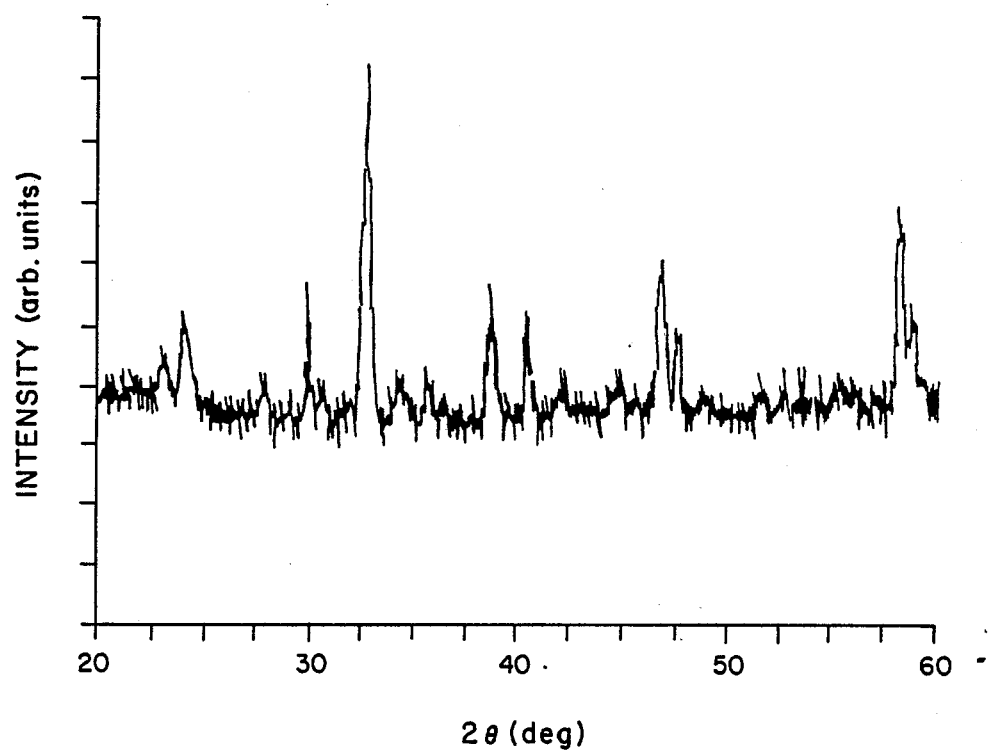
FIG. 3 is an X-ray Powder Diffraction Pattern for the product $YBa_2Cu_3O_7$ (with some BaO impurity).

The powder x-ray diffraction pattern of the sample is given in FIG. 3, with the d-spacings and assignments provided in Table 1. The x-ray diffraction pattern matches well with superconducting $YBa_2Cu_3O_7$ prepared by conventional methods, Qadri et al., Phys Rev B 35, 7235 (1987) with the exception of the small excess of BaO. The major peaks at 32.63° and 32.94° are representative of the orthorhombic phase of $YBa_2Cu_3O_7$ as is the remainder of the non-BaO portion of the diffration pattern.

Superconducting $YBa_2Cu_3O_7$ can be prepared in one heating cycle from a stoichiometric mixture of metal formates in the process of this invention. The product obtained has a 5% magnetic flux expulsion with an onset temperature of 95K.

Obviously many modifications and variations of the present invention are possible in light of the above teachings. It is therefore to be understood that within the scope of the appended claims, the invention may be practiced otherwise than as specifically described.

TABLE 1

| X-Ray Powder Diffraction Data for $YBa_2Cu_3O_7$ | | | |
|---|---|---|---|
| 2θ | d | $I/I_{max}$ | Phase |
| 22.96 | 3.8698 | 7 | 123 |
| 24.03 | 3.7003 | 17 | BaO |
| 27.82* | 3.2036 | 5 | 123 |
| 30.06 | 2.9706 | 24 | 123 |
| 30.57 | 2.9217 | 6 | 123 |
| 32.62 | 2.7424 | 42 | 123 |
| 32.94 | 2.7171 | 100 | 123 |
| 34.24 | 2.6165 | 7 | 123 |
| 35.65 | 2.5162 | 7 | 123 |
| 38.61 | 2.3298 | 17 | 123 |
| 38.80 | 2.3189 | 24 | 123 |
| 40.46 | 2.2273 | 19 | 123 |
| 42.14 | 2.1424 | 6 | BaO |
| 44.96 | 2.0146 | 8 | BaO |
| 45.70 | 1.9835 | 4 | 123 |
| 46.42 | 1.9545 | 4 | 123 |
| 46.89 | 1.9359 | 32 | 123,BaO |
| 47.67 | 1.9061 | 14 | 123 |
| 51.62 | 1.7693 | 4 | 123 |
| 52.71 | 1.7352 | 5 | 123 |
| 53.60 | 1.7083 | 4 | 123 |
| 55.47 | 1.6552 | 5 | 123 |
| 58.27 | 1.5820 | 36 | 123 |
| 58.89 | 1.5669 | 20 | 123 |

*Unresolved broad peak

What is claimed and desired to be secured by Letters Patent of the United States is:

1. A process of making substantially orthorhombic superconducting composition of the formula $A_nQ_mCu_3O_y$ wherein A is a Cuprate Superconducting Facilitating rare earth element, Q is a cuprate Superconducting Facilitating alkaline earth element, m is 1 or 2, n is 1 or 2 and y is $3n+2m+4/2$ comprising the steps of:
   (a) mixing together at least two of a salt of A, Q and Cu selected from the group consisting of a carbonate, nitrate and mixtures thereof to form a mixed salt of at least two of A, Q and Cu;
   (b) treating said mixed salt with a strong alkali metal base to precipitate and recover a mixed product of at least two of A, Q and Cu;
   (c) wet mixing the mixed product of at least two of A, Q and Cu with a lower alkyl carboxylic acid containing 1-6 carbon atoms in the carboxylic acid to form together the respective organic acid salts;
   (d) as needed, adding and wet mixing the stoichiometric quantity of the necessary acid salt selected from the group consisting of a carbonate, nitrate and mixtures thereof or oxide of A, Q or Cu to a form mixed compound of A, Q, and Cu;

(e) recovering and air drying said mixture compound; and (f) heating said wet mixed compounds from ambient temperature at a ratio of about 20° C. or less per minute to a preselected temperature in the range from about 500° C. to about 950° C.;

(g) holding said preselected temperature for at least 30 minutes and recovering the substantially orthorhombic superconducting composition.

2. The process according to claim 1 wherein the preselected temperature is about 900° C. to about 950° C.

3. A process according to claim 1 wherein the lower alkyl organic acid salts are selected from the group consisting of formates, acetates, and mixtures thereof.

4. A process according to claim 3 wherein Q is Barium and m is 2.

5. A process according to claim 4 wherein A is Yttrium and n is 1.

6. A process according to claim 1 wherein the lower alkyl organic acid salt is selected from the group consisting of formates, acetates and mixtures thereof.

7. A process according to claim 6 wherein A is Yttrium, Q is Barium, n is 1 and m is 2.

8. A process according to claim 7 wherein the preselected temperature is about 900° C. to about 950°C.

9. A process according to claim 7 wherein the selected temperature is about 920° C.

10. A process according of claim 1 wherein the alkali metal base is 5M NaOH.

11. A process according to claim 10 wherein A is Yttrium and Q is Barium.

12. A process according to claim 11 wherein the inorganic salt is a nitrate and the organic acid salt is a formate.

* * * * *